(12) United States Patent
Damle et al.

(10) Patent No.: US 7,920,419 B2
(45) Date of Patent: Apr. 5, 2011

(54) ISOLATED P-WELL ARCHITECTURE FOR A MEMORY DEVICE

(75) Inventors: Prashant Damle, Santa Clara, CA (US);
Krishna Parat, Palo Alto, CA (US);
Shafqat Ahmed, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 116 days.

(21) Appl. No.: 12/362,914

(22) Filed: Jan. 30, 2009

(65) Prior Publication Data
US 2010/0195383 A1 Aug. 5, 2010

(51) Int. Cl.
*G11C 16/04* (2006.01)
(52) U.S. Cl. ........... 365/185.02; 365/186.06; 365/185.7; 365/185.18; 365/185.33

(58) Field of Classification Search ............ 365/185.02, 365/185.06, 185.17, 185.18, 185.33
See application file for complete search history.

(56) References Cited

U.S. PATENT DOCUMENTS

| 5,734,609 | A * | 3/1998 | Choi et al. | ............ 365/185.17 |
| 7,157,771 | B2 * | 1/2007 | Forbes | ............ 257/330 |
| 7,570,517 | B2 * | 8/2009 | Kwak et al. | ............ 365/185.17 |

* cited by examiner

*Primary Examiner* — Viet Q Nguyen
(74) *Attorney, Agent, or Firm* — Cool Patent, P.C.; Joseph P. Curtin

(57) ABSTRACT

A memory device and a method to prevent or reduce program disturb by isolating P-wells of strings in a non-volatile memory array. During a program operation, the isolated P-wells may be coupled to corresponding bitlines, which may be selected or inhibited, and may be at different voltages. During erase, read, and verify operations, the isolated P-wells may be coupled to source.

15 Claims, 6 Drawing Sheets

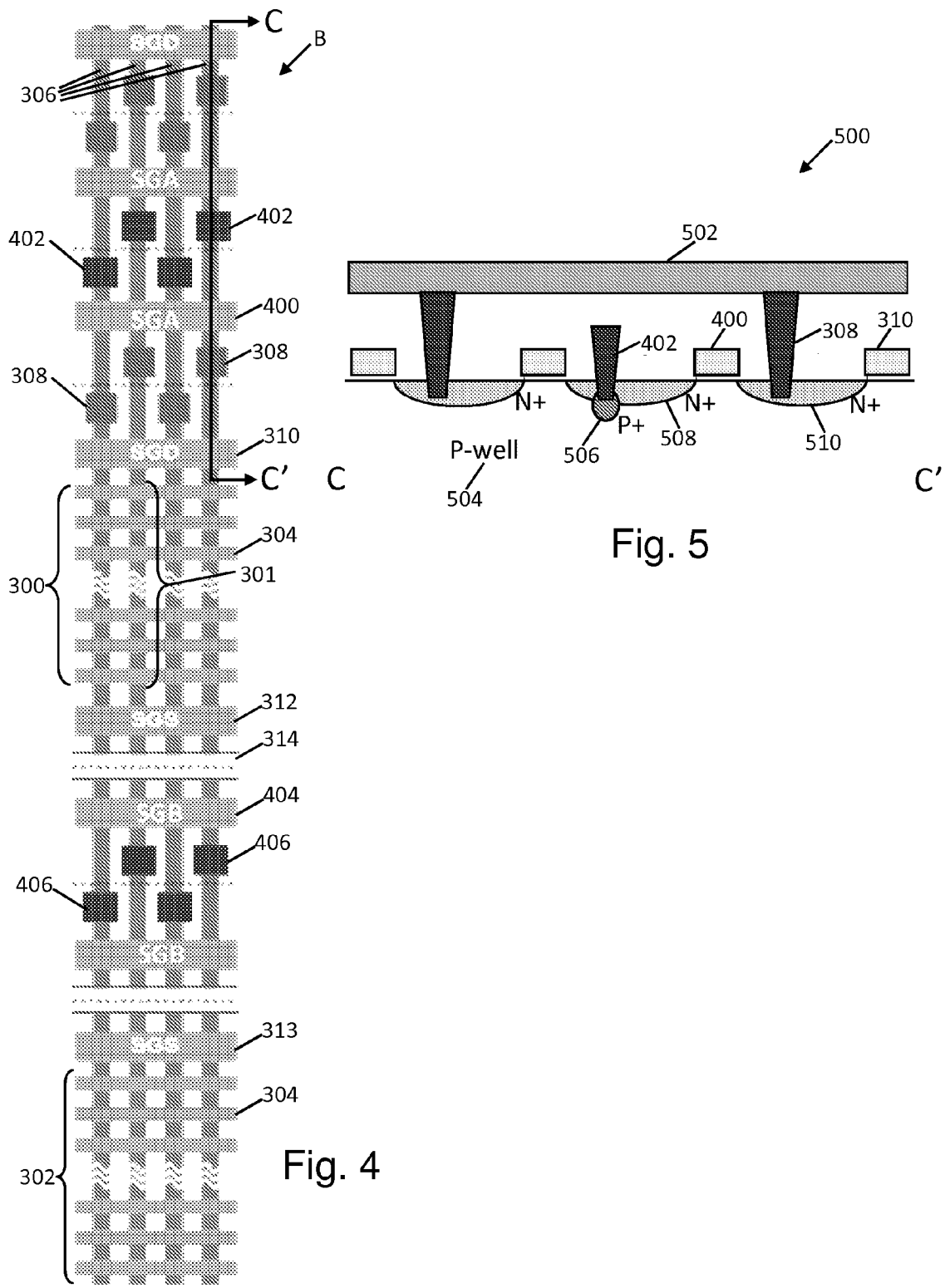

ns and circuits (all not shown), but the claimed
ISOLATED P-WELL ARCHITECTURE FOR A MEMORY DEVICE

BACKGROUND

Flash memory commonly uses Fowler-Nordheim tunneling for programming memory cells. The tunneling current is dependent on the voltage gap between the control gate and a channel region. When programming memory cells, program voltage is applied to a wordline containing cells being programmed and other cells, which are to be inhibited from programming. Program disturb occurs when programming of cells causes an inhibited memory cell on the same wordline to become inadvertently programmed.

Program disturb is expected to be a key limiter of NAND memory-cell scaling. As the memory-cell size is scaled down, the natural variation in the cell-to-cell programming behavior increases. As a result, it becomes harder and harder to keep a fast programming cell, which is in an erased state, from disturbing up while ensuring that a slow programming cell can program to a target threshold voltage Vt.

Increasing the channel-boost voltage may help the program disturb problem. Usually a higher channel-boost voltage is obtained by increasing the unselected wordline voltage V_inhibit. An increase in the V_inhibit is, however, limited by what is known as V_inhibit disturb in which cells on a selected string disturb up due to the high V_inhibit voltage.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

FIG. 4 is a physical representation of the semiconductor implementation of a portion of the P-well architecture of FIG. 2.

FIG. 5 is a cross-sectional view of FIG. 4 taken along C-C' according to one embodiment.

DETAILED DESCRIPTION

Figure 1:
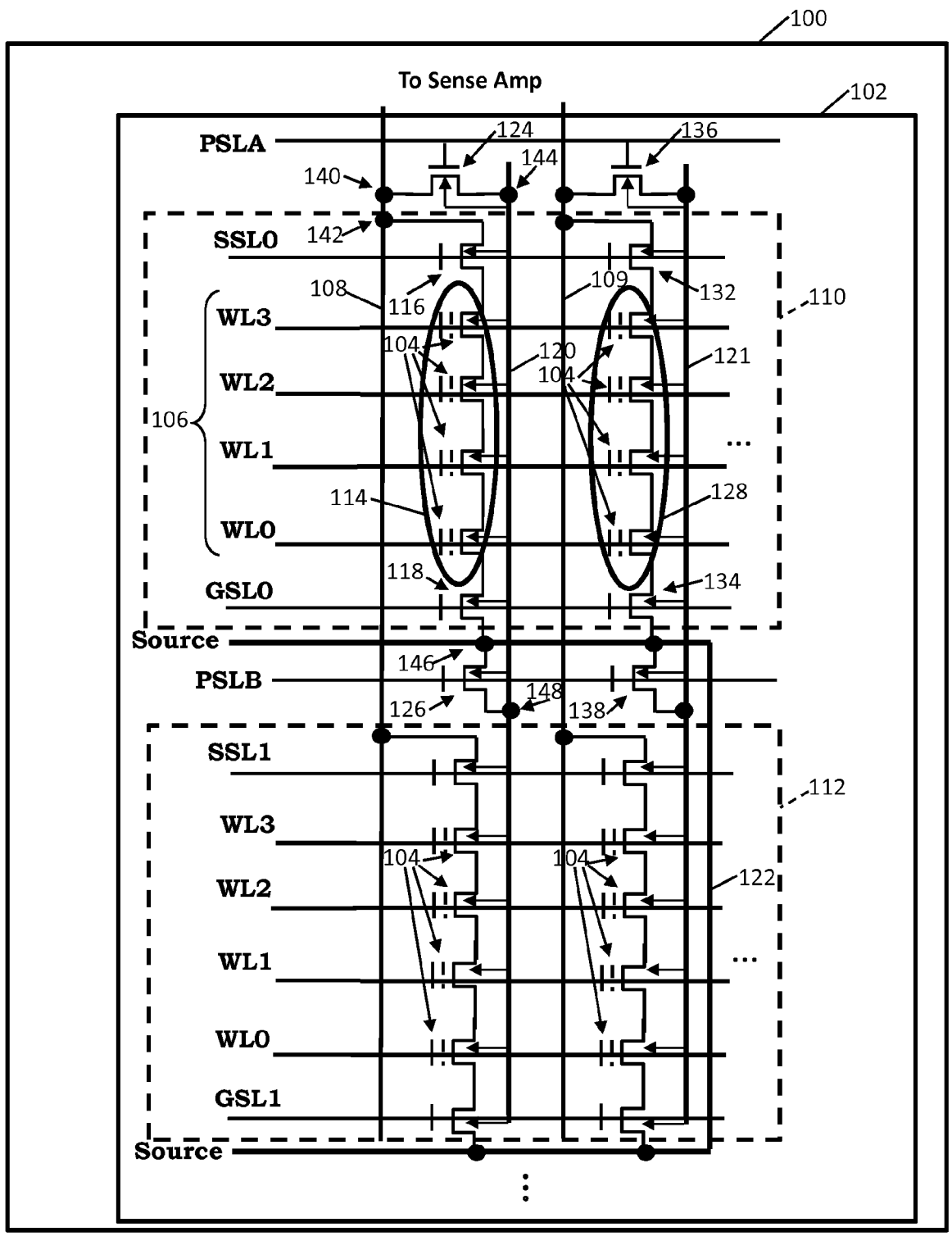
FIG. 1 is a simplified schematic diagram of a non-volatile memory device according to one embodiment.

Referring to FIG. 1, a simplified schematic diagram of a non-volatile memory device 100 is shown according to one embodiment. Memory device 100 includes a memory array 102 capable of storing data in memory cells. Memory device 100 may further include decoders, controllers, registers, buffers, charge pumps, sense amplifiers, and/or other memory components and circuits (all not shown), but the claimed subject matter is not limited in this respect.

Memory device 100 is depicted with a NAND flash memory array 102, which includes erasable and programmable non-volatile memory cells 104. Memory device 100 may include other types of non-volatile memory. Further, memory device 100 may be formed and manufactured using MOS (metal oxide semiconductor) technology, CMOS (complementary MOS) technology, BiCMOS (bipolar CMOS) technology, or other semiconductor manufacturing technologies suitable for forming memory. These are, however, merely examples of the different types of memory device 100, and the scope of the claimed subject matter is not limited in these respects.

Memory array 102 includes wordlines 106 and bitlines 108 and 109 capable of accessing data from memory cells 104, which are organized in pages, strings, and blocks. Memory cells 104 may be individually programmed and read, and further may be erased in blocks.

During programming of memory device 100, strings with memory cells that are not being programmed may be inhibited from programming, referred to herein as "inhibited strings". These strings may be coupled to bitlines driven with Vcc or other voltage for inhibiting the memory cells, referred to as "inhibited bitlines". Strings with memory cells that are being programmed, referred to as "selected strings", may be coupled to bitlines at 0 V or other programming voltage, referred to as "selected bitlines".

FIG. 1 shows a portion of memory array 102 with two blocks 110 and 112. Referring to the first block 110, a first string 114 includes serially connected memory cells 104 between a string select device 116 and a source select device 118. String select line SSL0 and ground select line GSL0 control the string select device 116 and the source select device 118, respectively.

A P-well 120, also referred to as "body" of a string, is coupled to memory cells 104 of the string 114. P-well 120 may be capable of coupling to bitline 108 and source 122. Bitline 108 corresponds to P-well 120 and is herein referred to as "corresponding bitline 108". Whether the P-well 120 is coupled to corresponding bitline 108 or source 122 may be controlled by a select gate 124 and/or a select gate 126. In one embodiment, in order for the P-well 120 to couple to corresponding bitline 108, the select gate 124 is enabled and the select gate 126 is disabled. For the P-well 120 to couple to source 122, the select gate 124 is disabled and the select gate 126 is enabled. In one embodiment, P-well 120 may be electrically isolated from an adjacent P-well 121.

Block 110 further includes a second string 128 with memory cells 104 serially connected and sandwiched between a string select device 132 and a source select device 134. String select line SSL0 and ground select line GSL0 also control the string select transistor 132 and the source select device 134, respectively. It is noted that block 110 may further include additional memory cells, select devices, strings, P-wells, bitlines, etc.

Similarly, P-well 121 is coupled to memory cells 104 of the string 128 and is adjacent to and may be isolated from P-well 120. P-well 121 may be capable of coupling to bitline 109 and source 122. Bitline 109 corresponds to P-well 121 and is herein referred to as "corresponding bitline 109". Whether the P-well 121 is coupled to corresponding bitline 109 or source 122 is controlled by a select gate 136 and/or a select gate 138. In one embodiment, for the P-well 121 to couple to the corresponding bitline 109, the select gate 136 is enabled and the select gate 138 is disabled. For the P-well 121 to couple to source 122, the select gate 136 is disabled and the select gate 138 is enabled.

A line PSLA controls the select gates 124 and 136 and a line PSLB controls the select gates 126 and 138. Line PSLA and line PSLB may control additional respective select gates that may be present in the block 110.

Memory array 102 may further include one or more contacts capable of electrically coupling two or more regions, as further described below. In memory array 102, a contact 140 may couple one terminal of select gate 124 to bitline 108, and a contact 142 may couple one terminal of string select device 116 to bitline 108. A contact 144 may couple one terminal of select gate 124 to P-well 120. A contact 146 may couple one terminal of source select device 118 and one terminal of select gate 126 to source 122. A contact 148 may couple one terminal of select gate 126 to P-well 120. In one or more embodiments, the contacts may comprise metal or other suitable material to couple two or more regions. In one embodiment, contacts at different locations may comprise different materials.

In one embodiment, during a program operation, the select gates 124 and 136 are enabled and the select gates 126 and 138 are disabled, the string 114 and P-well 120 are coupled to corresponding bitline 108, and the string 128 and P-well 121 are coupled to corresponding bitline 109. If string 114 has one or more memory cells 104 to be programmed, the corresponding bitline 108 is a selected bitline. If memory cells 104 of string 128 are not being programmed, the corresponding bitline 109 is inhibited.

In one embodiment, as a selected bitline, corresponding bitline 108 may be held at ground or a voltage V_sspc. V_sspc may be a value capable of slowing down cell programming to avoid overshooting a target voltage. For example, V_sspc may be approximately 1 V. At the same time, corresponding bitline 109 may be inhibited with a bitline and P-well bias of Vcc or higher. In one embodiment, corresponding bitline 108 is inhibited while corresponding bitline 109 is selected.

In one embodiment, during an erase operation, the select gates 124 and 136 and the bitlines 108 and 109 are floated, and the select gates 126 and 138 are enabled. The string 114 and P-well 120 and the string 128 and P-well 121 are then coupled to source 122. Additional strings and P-wells in block 110 may also be coupled to source 122.

In one embodiment, during a read or verify operation, the select gates 124 and 136 are disabled, and the select gates 126 and 138 are enabled. The string 114 and P-well 120 and the string 128 and P-well 121 are then coupled to source 122. Additional strings and P-wells in block 110 may also be coupled to source 122.

It should be understood that FIG. 1 is a simplified schematic diagram, and other components or mechanisms may be used to allow application of different voltages to the one or more P-wells. It should be further understood that although memory array 104 is shown with two NAND blocks with four wordlines, memory array 104 may include additional blocks, memory cells, wordlines, and bitlines. For example, strings may include 16 memory cells.

According to one or more embodiments, a program-inhibit scheme using isolation of P-wells may allow biasing up of the P-wells of inhibited strings while the P-wells of the selected strings are held at ground. In addition, the voltage on inhibited strings will not or will less likely cause the voltage of selected strings to disturb up.

Figures 2, 3:
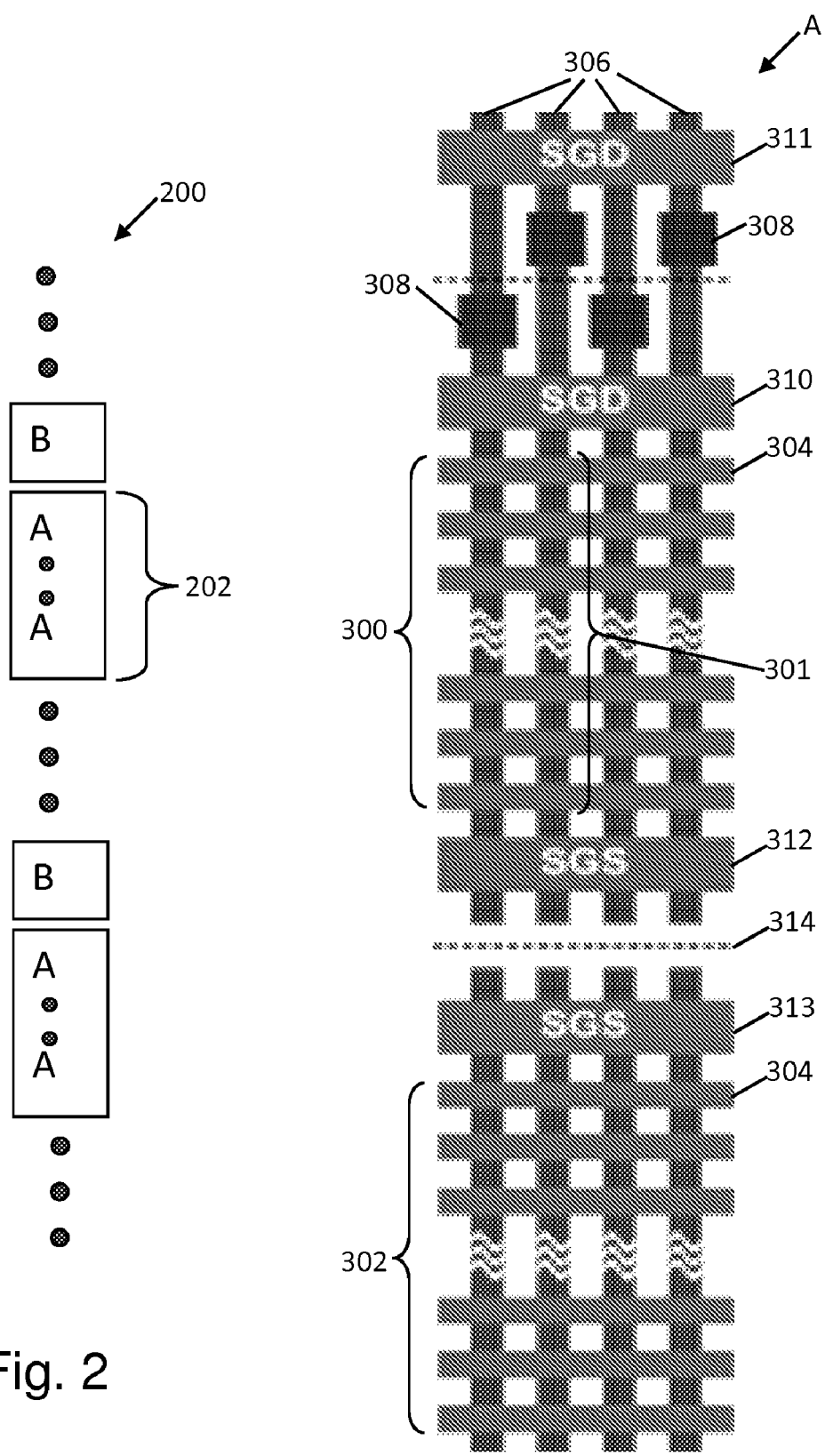
FIG. 2 is a schematic diagram of P-well array architecture according to one embodiment.
FIG. 3 is a physical representation of the semiconductor implementation of a portion of the P-well architecture of FIG. 2.

Referring to FIG. 2, a schematic diagram of a NAND memory array of a memory device is shown at 200 according to one embodiment. The NAND memory array 200 may be formed by coupling structures A and B. Structure B may repeat after a number of occurrences of structure A. The frequency of occurrence of structure B may be determined by factors, such as the P-well resistive-capacitive (RC) delay and the die size impact, but the claimed subject matter is not limited in this respect. In one embodiment, the overall die size impact of NAND memory array 200 is approximately two percent more than a conventional NAND array. In one embodiment, structure B occurs once after approximately eight occurrences of structure A (at box 202). Structures A and B are shown in more detail in FIGS. 3 and 4, respectively.

Referring now to FIGS. 3 and 4, top views of a semiconductor implementation of portions of NAND memory array 200 according to one embodiment are shown. FIG. 3 shows additional details of structure A of FIG. 2. FIG. 4 illustrates additional details of structure B of FIG. 2.

As pictured in the first column of FIG. 3, structure A includes two NAND strings 300 and 302. Structure A may include additional columns of NAND strings arranged in a similar layout to NAND strings 300 and 302. For example, a string 301 in the next column is adjacent to string 300.

Memory cells (not depicted) may be located at or in proximity to the intersections of wordlines 304 and active areas 306. Select gate drain devices (also not depicted) may be located at or in proximity to the intersections of select gate drain (SGD) 310 and active areas 306. Select gate source devices (also not depicted) may be located at or in proximity to the intersections of select gate source (SGS) 312 and active areas 306. For simplicity in explaining one or more embodiments herein, an individual device may be referred to interchangeably with a collective row of devices, for example, an SGD device may be referred to as SGD and vice versa.

Structure A may include wordlines 304 between SGD 310 and SGS 312. Structure A further includes a source slot 314 that may be shared by SGS 312 and SGS 313, as further discussed below. SGD 310 and SGS 312 may be enabled or disabled to control memory cells in string 300 and adjacent strings. Structure A may further include SGD 311 which shares contacts 308 and couples with another structure A or with a structure B.

For simplicity, only four active areas 306 are shown and depicted by the columns. Active areas 306 may include P-wells and channel-source-drain regions. Active areas 306 may be coupled to bitlines (not shown) via contacts 308. The four active areas 306 may be coupled to four corresponding bitlines.

Turning to FIG. 4, structure B includes a basic structure similar to structure A of FIG. 3 and further includes additional select gates and contacts for coupling the active areas 306 to bitlines and source. In FIG. 4, structure A components also present in structure B have been labeled accordingly. With reference to string 300, structure B includes a select gate 400 ("SGA") coupled to a contact 402 capable of accessing a P-well and further includes a select gate 404 ("SGB") coupled to a contact 406 also capable of accessing the P-well.

In one embodiment, when select gate 400 is enabled, the P-well and the corresponding bitline are coupled together, therefore bringing the P-well to voltage V_inhibit, V_program, or other predetermined voltage on the corresponding bitline. Conversely, when select gate 400 is disabled, the P-well and corresponding bitline are not coupled. Similarly, when select gate 404 is enabled, the P-well and the source slot 314 are coupled together, therefore bringing the P-well to source. Conversely, when select gate 404 is disabled, there is no coupling between the P-well and the source slot 314.

In one embodiment, during a program operation, SGA 400 is enabled while SGB 404 is disabled, therefore driving the P-well to a bitline voltage on a corresponding bitline. For example, the corresponding bitline may be biased to an inhibited voltage. Referring to string 301 located adjacent to string 300, while SGA 400 is enabled and SGB 404 is disabled, the P-well of string 301 may also be driven to a bitline voltage on a corresponding bitline. For example, the corresponding bitline may be biased to a programming voltage.

During an erase operation in accordance with one embodiment, the P-wells, bitlines and the source may be biased to a voltage V_erase. For example, V_erase may range from approximately 15-20 V. To couple P-wells to the source, the source is biased to V_erase and SGB is biased to (V_erase+Vt), as further illustrated by a program scheme shown in FIG. 9. The SGA transistors and all the bitlines are left floating, and will float up to approximately V_erase.

It should be noted that since all four terminals of SGA and SGB are biased to approximately V_erase, SGA and SGB may not need to support high voltage. There may be AC-timing effects that may create a high field across the SGB gates for a short period of time depending on the location within the memory device. The high fields may be due to the source and corresponding P-well rise time being slower than the SGB gate rise time. To eliminate such AC high-field effects, the SGB gates may be ramped up in several small increments (for example, 5 V) with sufficient delay between increments in order to ensure that the bias difference between the SGB gate, and source and corresponding P-well does not exceed the voltage that may be supported by the SGB gate oxide.

According to one or more embodiments, the layout design may be reflected over one or more components such that space may be conserved on the memory device. For example, turning back to FIG. 3, the implementation has string 300 reflected over contacts 308 and source slot 314. In other words, the SGD device 310 of string 300 may share contacts 308 with an SGD device 311 which may be attached to a string (not shown) above string 300 (in the y-direction). The string above string 300 may be a part of another structure A or structure B. Similarly, source slot 314 may be shared by strings 300 and 302; hence, the SGS device 312 of string 300 and the SGS device 313 of string 302 may be coupled to the source slot 314 on either side.

Further, in FIG. 4, the implementation has string 300 reflected over contacts 402 and contacts 406. Therefore, the string above string 300 may share the contact 402 with string 300. In contrast with FIG. 3, string 302 of FIG. 4 may share contact 406 instead of sharing source slot 314. It is noted that the layout design may vary from what is illustrated, but nevertheless is within the scope of the claimed subject matter.

FIG. 5 shows a y-pitch cross-section 500 of structure B of FIG. 2 (also FIG. 4) taken along CC'. The cross-section 500 shows bitline material ("bitline") 502, not previously shown in FIGS. 3 and 4. Access to P-well 504 may be achieved by using contact 402, which may comprise a butted $N^+P^+$ contact 402. The butted $N^+P^+$ contact 402 is not coupled to a metal layer such as bitline 502.

In one embodiment, a $P^+$ region 506 in the butted $N^+P^+$ contact 402 may be formed in a self-aligned manner using a $P^+$ implant through an opening of the butted $N^+P^+$ contact 402 prior to a contact metallization process. An $N^+$ region 508 may be located above the $P^+$ region 506. The butted $N^+P^+$ contact 402 may connect the $N^+$ region 508, via $P^+$ region 506, to the P-well 504. As shown, the components may be reflected over contact 402, as discussed above.

In one embodiment, select gate 400 may control whether P-well 504 is coupled to bitline 502. When select gate 400 is enabled, the $N^+$ region 508 couples to a neighboring $N^+$ region 510 which is coupled to bitline 502 via contact 308. In one embodiment, select gate 310 may control whether a string (not shown) is coupled to bitline 502.

As mentioned above, the overall die size impact of the NAND memory array 200 may be small. For example, the die size impact of the NAND memory array 200 may be approximately 2% more than a conventional NAND array. In one embodiment, the die size impact may be reduced by replacing the butted $N^+P^+$ contact 402 with an $N^+P^+$ tunnel junction contact where an ohmic contact may be formed as a result of band to band tunneling in a heavily doped $N^+P^+$ junction. The replacement may obviate inclusion of contact metal for the butted $N^+P^+$ contact 402.

Figure 6:
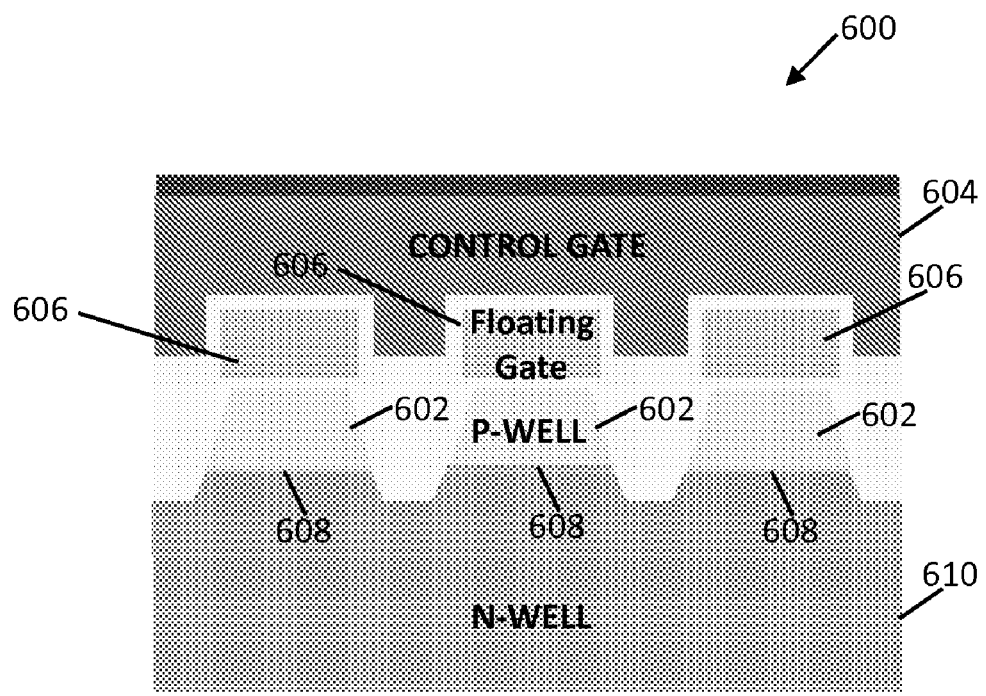
FIG. 6 is a cross-sectional representation showing P-well isolation according to one embodiment.
Figure 7:
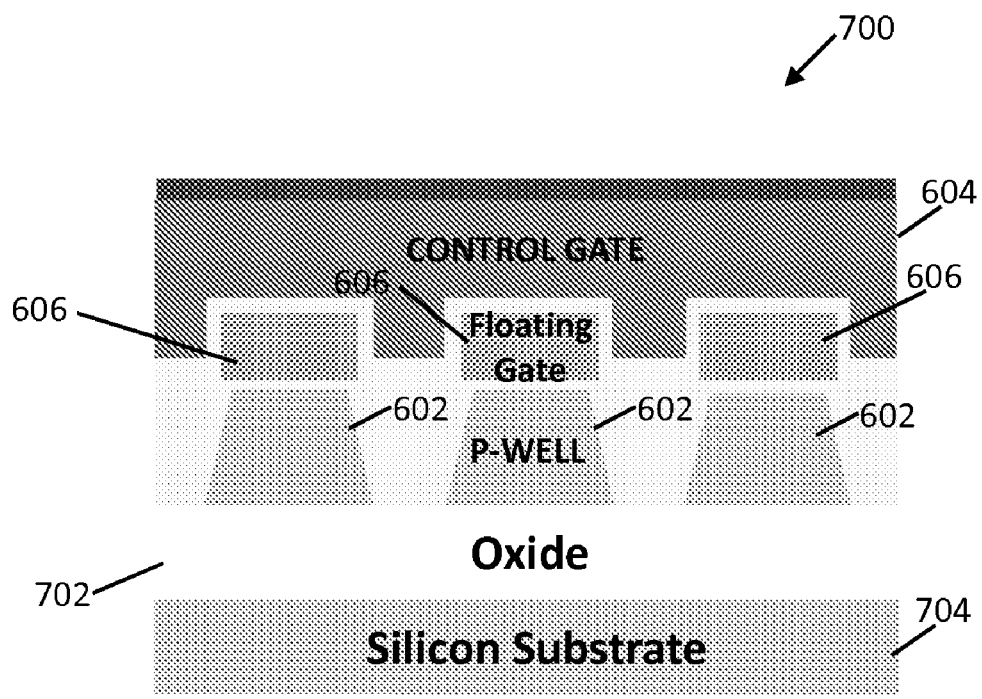
FIG. 7 is a cross-sectional representation showing P-well isolation according to one embodiment.

Turning now to FIGS. 6 and 7, cross-sectional representations 600 and 700 each illustrate a portion of a memory array in a memory device according to one or more embodiments. Representations 600 and 700 each include an x-pitch cross-section and depict P-wells 602 isolated from one another. In one or more embodiments, the P-wells 602 do not directly contact one another physically or electrically. Representations 600 and 700 further show a control gate 604 that may be coupled to floating gates 606. Floating gates 606 may be coupled to P-wells 602 located beneath the floating gates 606. A silicon dioxide insulator or other material with a high dielectric constant (not shown) may be in between one or more components.

As shown in FIG. 6, an N-well 610 may be located beneath P-wells 602. Isolation of the P-wells 602 may be achieved by targeting N-well junctions 608 to a depth of less than the memory-array trench depth according to one embodiment. As shown in FIG. 7, the P-well isolation may be achieved by using silicon-on-insulator (SOI) technology. The memory array of FIG. 7 may include a layer of buried oxide 702 and silicon substrate 704. Other methods of creating P-well to P-well isolation may be used and the claimed subject matter is not limited in this respect.

Figure 8:
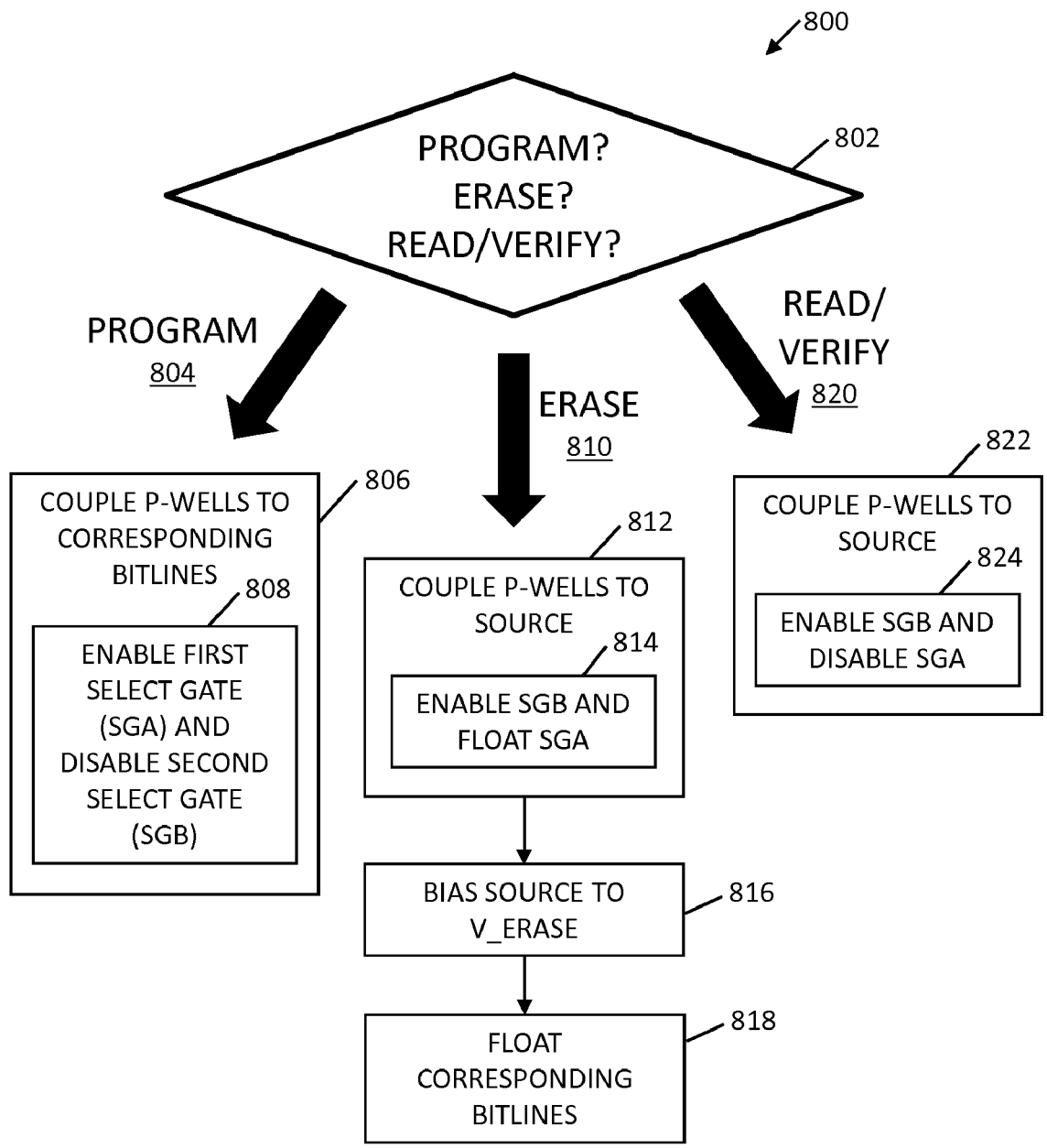
FIG. 8 is a flowchart of a method according to one embodiment.

In FIG. 8, a method 800 of reducing program disturb in a memory device according to one embodiment is shown. At 802, the method 800 includes determining whether one or more memory cells in the memory device are being programmed, erased, read or verified for program/erase. In a program operation 804 in which one or more memory cells are being programmed by one or more programming pulses, the method 800 includes, at 806, coupling wells to corresponding bitlines. The P-wells may be isolated from one another, and may be separately driven to the voltage of the corresponding bitlines, as described above. Box 806 may include, at 808, enabling a first select gate ("SGA") capable of coupling the P-wells to corresponding bitlines, and disabling a second select gate ("SGB") capable of coupling the P-wells to source.

In an erase operation 810 where one or more memory cells are being erased by one or more erase pulses, the method 800 includes, at 812, coupling the P-wells to source. Box 812 may include, at 814, enabling SGB and floating SGA. The method 800 may further include biasing source to a voltage V_erase or other predetermined erase voltage at 816, and floating bitlines at 818. In one embodiment, when floated, SGA and the bitlines may float up to approximately V_erase. In one embodiment, to enable SGB and couple the P-wells to source, the voltage at SGB may be biased to a predetermined voltage, for example, (V_erase+Vt).

In a read or verify operation 820 in which one or more memory cells are read or verified in programming or erasing, the method 800 includes, at 822, coupling the P-wells to source. Box 822 may include, at 824, enabling SGB and disabling SGA.

It is noted that various boxes of method of 800 may be modified, added, or removed depending on a specific implementation while still being within the scope of the claimed subject matter. Further, in one or more embodiments, the boxes of method 800 are not limited to the order in which method 800 is presented. For example, during program operation, program verification may occur between programming pulses to determine whether one or more memory cells have been successfully programmed.

Figure 9:
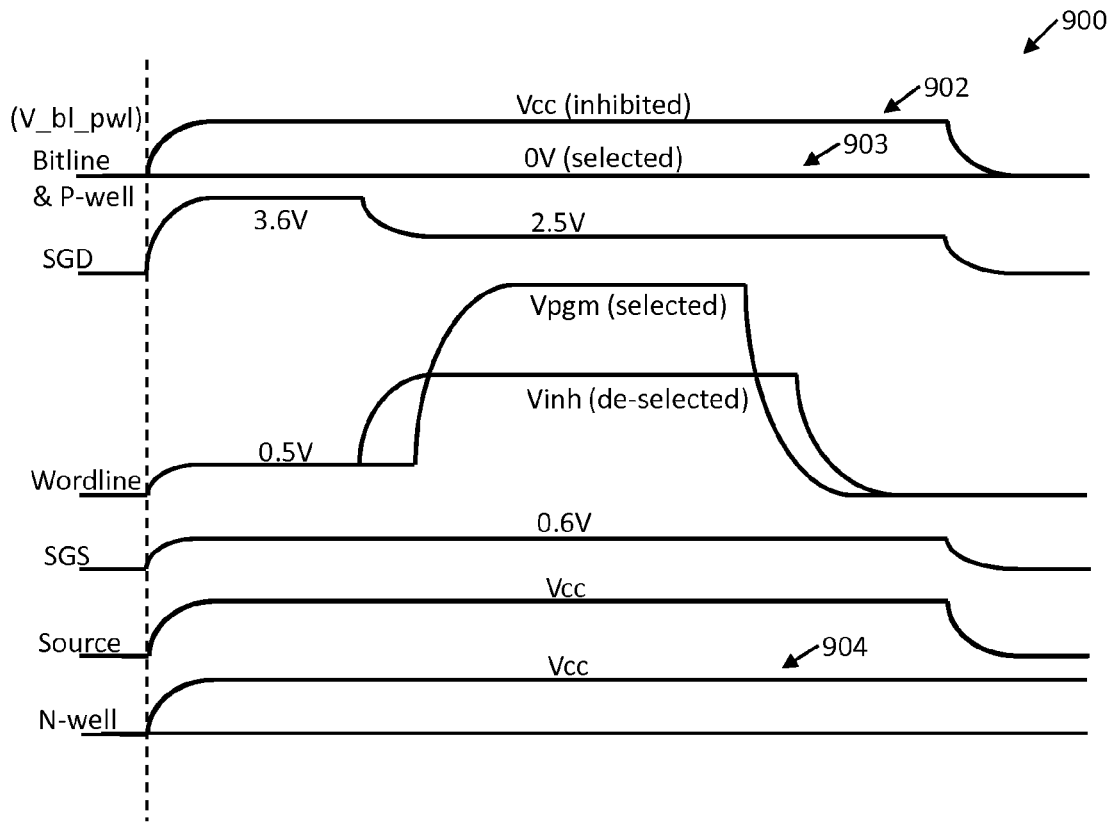
FIG. 9 is a timing chart indicating the voltage at various components of a memory device according to one embodiment.

FIG. 9 is a timing chart 900 indicating the voltage at various components of a memory device during a program operation according to one embodiment. In a program operation, the voltages of selected and inhibited bitlines and corresponding P-wells, string select device SGD, selected and deselected wordlines, source select device SGS, source, and N-well are shown as examples. During a programming pulse, a bitline and P-well bias ("V_bl_pwl") 902 may be Vcc or higher on inhibited bitlines and corresponding P-wells. On selected bitlines and corresponding P-wells, a bitline and P-well bias V_bl_pwl 903 may be 0 V, V_sspc, or other predetermined voltage for programming one or more memory cells on the selected bitlines. In one embodiment, V_bl_pwl 902 and V_bl_pwl 903 may be equivalent to respective corresponding bitline voltages. In a conventional scheme, the voltage at source is (Vcc−Vtn) and the voltage at N-well is 0 V. In one embodiment, source and N-well may be at Vcc. In one embodiment, N-well may be held at Vcc throughout the programming operation.

In one embodiment, by applying V_bl_pwl 902 (which equals Vcc or higher) to an inhibited cell, a memory cell being inhibited on an inhibited string, while keeping V_bl_pwl 903 (which is 0 V or ground) on a selected cell, a memory cell being programmed on a selected string, one or more of the following effects may occur. One effect may be that an inhibited channel, channel of an inhibited string, acquires a seed voltage that may help prevent program disturb. One effect may be a reduction of the program-disturb electric field in the tunnel oxide of inhibited cells. One effect may be the reduction of the loss of channel-boost voltage (by an amount approximate or equivalent to Vcc) due to channel-source-drain region to P-well junction leakage. One effect may be the removal of free electrons from the inhibited string, thereby limiting the supply of electrons available to cause program disturbance.

In one embodiment with a non-SOI implementation where the P-well is located in the N-well, such as shown in FIG. 6, the N-well may be biased to V_bl_pwl 902 (for example, Vcc) to prevent the P-well to N-well junction from getting forward biased. The P-well to N-well junction on selected bitlines would be under reverse bias. The N-well may remain at this voltage as shown at 904 through the programming operation, including pulsing and verification, in order to eliminate or reduce impact to programming time due to large N-well RC delay. The N-well voltage is not applicable to one or more embodiments with an SOI implementation.

Figure 10:
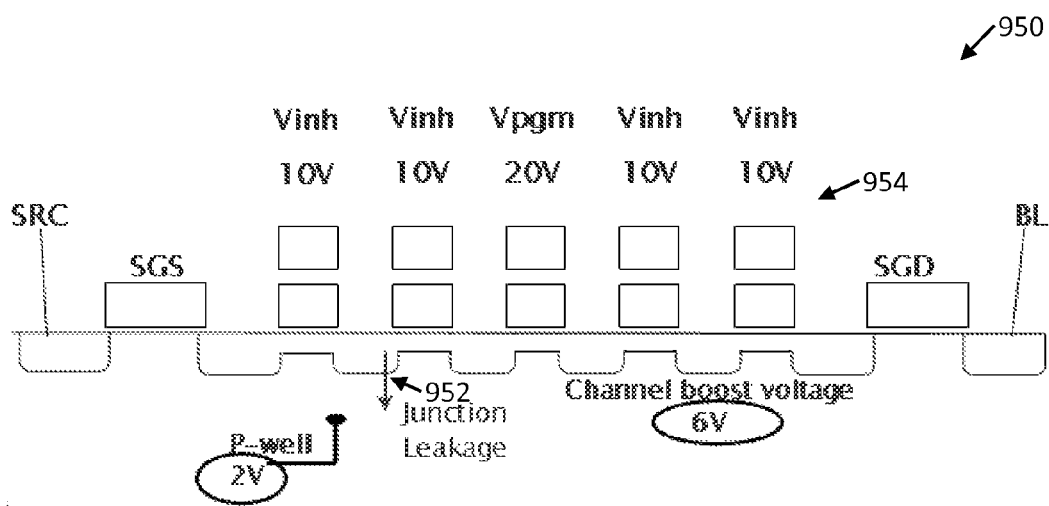
FIG. 10 is a cross-sectional view illustrating junction leakage in a memory device according to one embodiment.

FIG. 10 shows a cross-sectional view 950 illustrating junction leakage 952 in a portion of a memory device according to one embodiment. The cross-section is taken along the y-direction and shows an inhibited string 954 with five memory cells in series. Voltages Vinh and Vpgm may be applied to one or more memory cells during programming. As mentioned above, the P-well on an inhibited string 954 may be biased to Vcc or higher while the P-well on a selected string (not shown) is grounded. For example, the P-well bias on the inhibited string may be 2 V. The bias on the P-well of the inhibited string may reduce the reverse bias between the channel-source-drain region to P-well junction, and thus reduces the junction leakage. As a result the channel-boost voltage does not discharge after being boosted and stays at the value dictated by the deselected wordline voltage Vinh. The increased channel-boost voltage may reduce the program disturb and enable NAND cell scaling.

It is appreciated that isolated P-well architecture for a memory device has been explained with reference to one or more embodiments, and that the claimed subject matter is not limited to the specific details given above. References in the specification made to other embodiments fall within the scope of the claimed subject matter.

Any reference to device may include a component, circuit, module, or any such mechanism in which the device can achieve the purpose or description as indicated by the modifier preceding the device. The component, circuit, module, or any such mechanism is, however, not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the claimed subject matter is not limited to the details described above. Rather, it is the following claims including any amendments thereto that define such scope and variations.

What is claimed is:

1. A memory device, comprising:
a memory array comprising memory cells arranged in a first string and a second string, the first string coupled to a first P-well and the second string coupled to a second P-well, wherein the first P-well is isolated from the second P-well, wherein the first P-well is capable of being biased to a voltage different from the voltage of the second P-well, and wherein the first P-well is biased to approximately Vcc or higher and the second P-well is biased to ground.

2. The memory device of claim 1, wherein the first P-well is coupled to a first corresponding bitline and the second P-well is coupled to a second corresponding bitline.

3. The memory device of claim 2, further comprising a first contact capable of coupling the first P-well to the first corresponding bitline.

4. The memory device of claim 3, further comprising a second contact capable of coupling the second P-well to the second corresponding bitline.

5. The memory device of claim 2, further comprising a first select gate capable of coupling of the first P-well with the first corresponding bitline and coupling of the second P-well with the second corresponding bitline.

6. The memory device of claim 5, wherein coupling of the first P-well to the first corresponding bitline and the second P-well to the second corresponding bitline occurs during a program operation.

7. The memory device of claim 6 further comprising a second select gate capable of coupling of the first P-well and the second P-well to source.

8. The memory device of claim 1, wherein during an erase operation, the first P-well and the second P-well are coupled to source.

9. The memory device of claim 8, wherein source is biased to a predetermined erase voltage.

10. The memory device of claim 1, wherein the voltage applied to the first P-well reduces reverse bias between a channel-source-drain region of the first string and a first P-well junction.

11. The memory device of claim 1, wherein the first P-well is adjacent to the second P-well.

12. A memory device, comprising:
a NAND memory array comprising a first NAND string coupled to a first P-well and a second NAND string coupled to a second P-well, wherein the first P-well is capable of being biased to a voltage different from the voltage of the second P-well, and wherein the first P-well is biased to approximately Vcc or higher and the second P-well is biased to ground;
a first select gate capable of coupling the first P-well with a first bitline and the second P-well with a second bitline; and
a second select gate capable of coupling the first P-well and the second P-well to source.

13. The memory device of claim 12, further comprising a first contact coupling the first P-well to the first bitline and a second contact coupling the second P-well to the second bitline.

14. The memory device of claim 12, wherein the first bitline comprises an inhibited bitline and the second bitline comprises a selected bitline.

15. The memory device of claim 12, wherein the voltage applied to the first P-well reduces reverse bias between a channel-source-drain region of the first string and a first P-well junction.

* * * * *